United States Patent
Beck et al.

(10) Patent No.: US 10,279,379 B2
(45) Date of Patent: *May 7, 2019

(54) UNIFORM FLUID MANIFOLD FOR ACOUSTIC TRANSDUCER

(71) Applicant: Product Systems Incorporated, Campbell, CA (US)

(72) Inventors: Mark J. Beck, Los Gatos, CA (US); Eric G. Liebscher, San Jose, CA (US)

(73) Assignee: Product Systems Incorporated, Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/723,139

(22) Filed: Oct. 2, 2017

(65) Prior Publication Data

US 2018/0021821 A1 Jan. 25, 2018

Related U.S. Application Data

(63) Continuation of application No. 13/536,944, filed on Jun. 28, 2012, now Pat. No. 9,796,000.

(60) Provisional application No. 61/504,300, filed on Jul. 4, 2011.

(51) Int. Cl.
*B08B 3/12* (2006.01)
*H01L 21/67* (2006.01)

(52) U.S. Cl.
CPC .......... *B08B 3/12* (2013.01); *H01L 21/67051* (2013.01)

(58) Field of Classification Search
CPC .................................. B08B 3/12; H01L 21/67
See application file for complete search history.

(56) References Cited

U.S. PATENT DOCUMENTS

| | | | | |
|---|---|---|---|---|
| 6,791,242 | B2* | 9/2004 | Beck | B08B 3/12 134/1.3 |
| 7,338,131 | B2* | 3/2008 | Forgatsch | B64D 11/06 297/188.08 |
| 2002/0063169 | A1* | 5/2002 | Verhaverbeke | H01L 21/67051 239/436 |
| 2004/0065540 | A1* | 4/2004 | Mayer | C23C 18/1619 204/198 |
| 2005/0003737 | A1* | 1/2005 | Montierth | A61B 8/546 451/5 |
| 2005/0118932 | A1* | 6/2005 | Talieh | B24B 37/30 451/41 |
| 2007/0169800 | A1* | 7/2007 | Fani | B08B 3/12 134/56 R |
| 2008/0017219 | A1* | 1/2008 | Franklin | B08B 3/12 134/1 |
| 2008/0166208 | A1* | 7/2008 | Lester | H01L 21/67051 414/217 |
| 2008/0230092 | A1* | 9/2008 | Ko | B08B 3/024 134/36 |

(Continued)

*Primary Examiner* — Michael E Barr
*Assistant Examiner* — Benjamin L Osterhout
(74) *Attorney, Agent, or Firm* — Donald J. Pagel

(57) ABSTRACT

A fluid manifold comprised of a manifold adapted to deliver fluid directly into a gap formed between a surface of a substrate and an acoustic transducer. The fluid is delivered into the gap at a variable rate along a length of the manifold. Preferably, the manifold includes a plurality of apertures positioned along the length of the manifold for dispensing the fluid into the gap at the variable rate.

11 Claims, 4 Drawing Sheets

(56) References Cited

U.S. PATENT DOCUMENTS

2009/0090381 A1* 4/2009 Li ............................ B08B 3/12
134/1
2011/0155169 A1* 6/2011 Holsteyns ................ B08B 3/12
134/1.3

* cited by examiner

UNIFORM FLUID MANIFOLD FOR ACOUSTIC TRANSDUCER

This application is a continuation of application Ser. No. 13/536,944, filed Jun. 28, 2012, which claims the benefit of Provisional Application 61/504,300, filed Jul. 4, 2011.

BACKGROUND OF THE INVENTION

FIG. 1 illustrates a standard substrate cleaning system 10 known in the prior art. In the system 10, a nozzle 14 dispenses a fluid 18 onto a surface 22 of a rotating substrate 26, such as a semiconductor wafer. The fluid 18 spreads out over the surface 22 and fills a gap 30 underneath an acoustic transducer 34. The fluid in the gap is energized by acoustic energy from the transducer 34. The combined effect of the fluid 18 and the acoustic energy is to process or clean the surface, such as by the removal of small particles from the surface. U.S. Pat. No. 6,791,242 is representative of this type of prior art substrate cleaning system.

There are several problems with the prior art cleaning systems. First, dispensing fluid onto the surface 22 is wasteful because only fluid that fills the gap 30 is primarily involved in cleaning or processing the surface. Excess fluid on the surface can increase the cost associated with cleaning, which can be significant when specialty cleaning fluids are used. Second, excess fluid can create environmental and safety problems, such as when evaporation or atomization causes dangerous gasses to be released from the fluid.

Third, when the substrate 26 rotates slowly, the fluid can wrap around to the backside of the substrate, thereby contaminating the backside of the substrate as well as the substrate holding or mounting equipment. For this reason, higher rotation speeds are preferred during substrate processing. But higher rotation speeds mean that more process fluid must be dispensed on the surface in order to keep the gap filled with fluid, thereby creating more wasted fluid.

Fourth, when excess fluid sits on the surface, the properties and characteristics of the fluid, such as temperature and gas content, can change. For reasons such as these, a way to reduce the volume of fluid being dispensed during a substrate cleaning process is needed.

SUMMARY OF THE INVENTION

Briefly, the fluid manifold of the present invention comprises a manifold adapted to deliver fluid directly into a gap formed between a surface of a substrate and an acoustic transducer. The fluid is delivered into the gap at a variable rate along a length of the manifold. Preferably, the manifold includes a plurality of apertures positioned along the length of the manifold for dispensing the fluid into the gap. To achieve the variable rate of fluid delivery, the plurality of apertures may dispense the fluid at different rates, or the plurality of apertures may have different sizes, or there may be different distances between adjacent apertures. Alternatively, another method or design feature can be used to deliver the fluid into the gap at a variable rate. In a preferred embodiment, the fluid manifold is used in conjunction with an acoustic transducer that has a wedge shape, although other shapes may be used for the transducer.

DETAILED DESCRIPTION OF THE INVENTION

Figure 2:
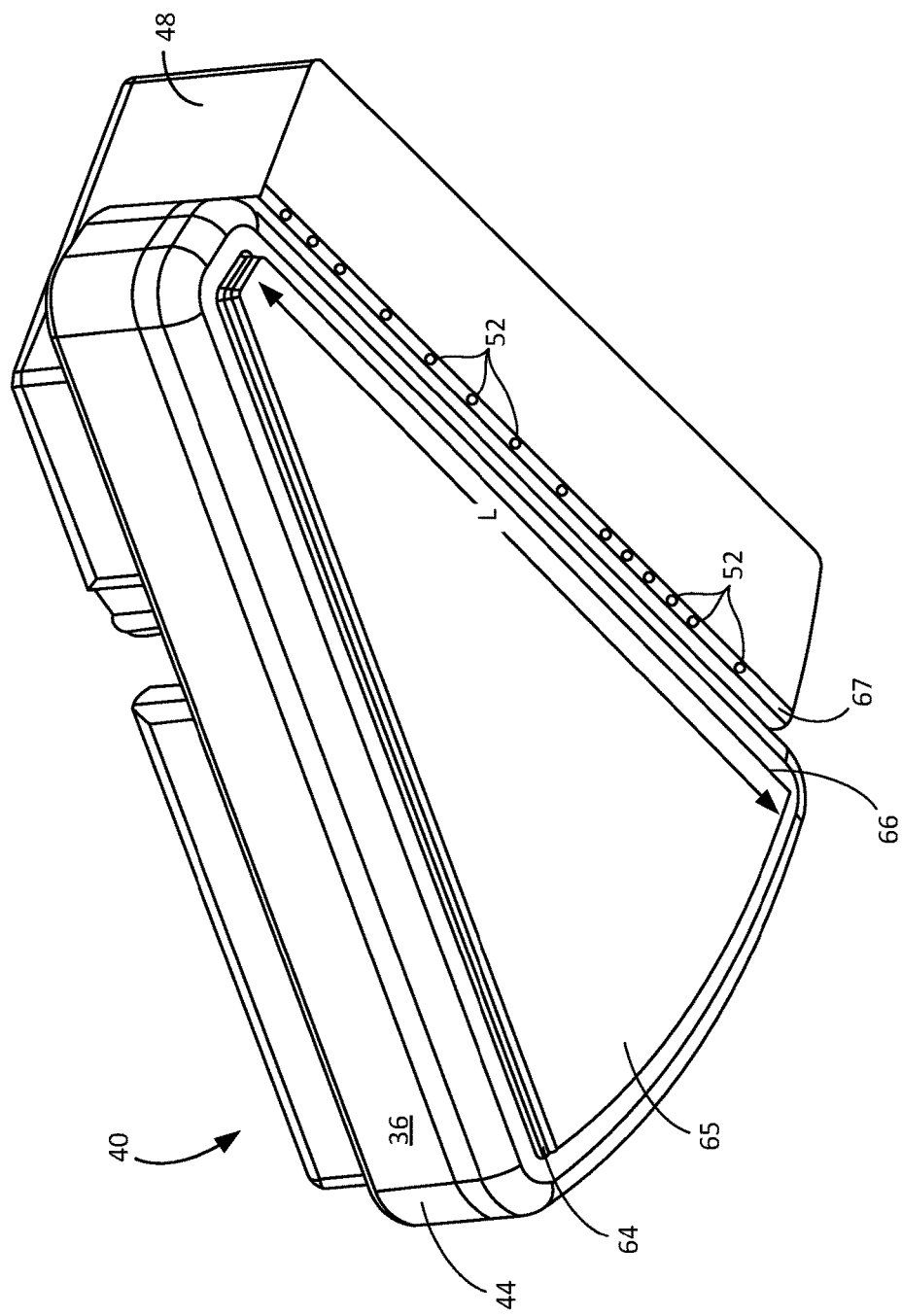
FIG. 2 is a prospective view of a transducer assembly according to the present invention.

FIG. 2 illustrates a cleaning assembly 40 that comprises an acoustic transducer 44 and a fluid manifold 48. The fluid manifold 48 is positioned adjacent to the transducer 44 and includes a plurality of apertures 52 from which a fluid 56 (shown in FIG. 3) can be dispensed. A fluid inlet (not shown) provides a means for introducing the fluid 56 into the manifold 48.

A resonator 64 is attached to the bottom of the transducer 44 and has a face 65. For reference purposes, the resonator 64 has a side 66 that has a length "L" and is referred to as the leading edge of the transducer 44. Many types of transducers capable of producing acoustic energy can be used as the transducer 44. In the preferred embodiment, the transducer 44 is a wedge-shaped transducer such as is described in U.S. Pat. No. 6,791,242, issued to Beck et al. on Sep. 14, 2004, which is incorporated herein by reference. Additionally, it is preferred that the acoustic transducer 44 produce acoustic energy in the frequency range of 300 KHz to 5 MHz. For example, the transducer 44 may be comprised of an acoustic energy generating means, such as one or more piezoelectric crystals. A housing 36 covers the acoustic energy generating means and the electronic circuitry associated with the acoustic energy generating means to protect them from moisture and other contaminants.

In a preferred embodiment, the manifold 48 has a face 67 that is positioned adjacent to the side 66 of the resonator 64. The plurality of apertures 52 are arrayed along the face 67 and the face 67 is angled so that fluid dispensed from the apertures 52 will be directed downward in the direction of the side 66.

Figure 1:
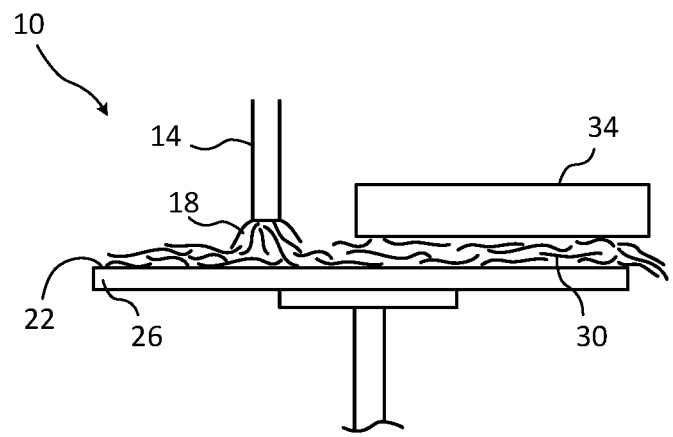
FIG. 1 illustrates a substrate cleaning system 10 according to the prior art.
Figure 3:
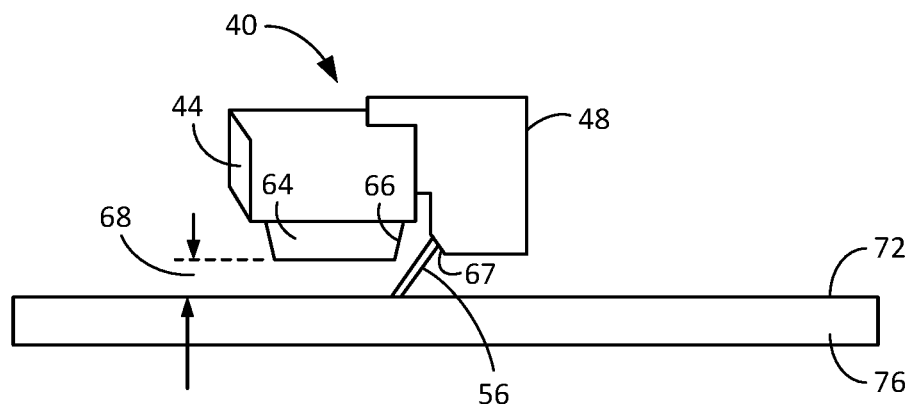
FIG. 3 is a schematic view of the transducer assembly according to the present invention.

FIG. 3 illustrates a volume of the fluid 56 as it is being dispensed from the apertures 52. A gap 68 is formed by the space that exists between the face 65 on the bottom of the resonator 64 and a surface 72 of a substrate 76. Preferably, the substrate 76 is a rotating substrate having a circular shape, such as a semiconductor wafer, but other types of substrates can be used with the assembly 40. The combined effect of the fluid 56 and the acoustic energy provided by the transducer 44 is to process or clean the surface 72, such as by the removal of small particles from the surface 72, such as the removal of submicron particles.

Figure 5:
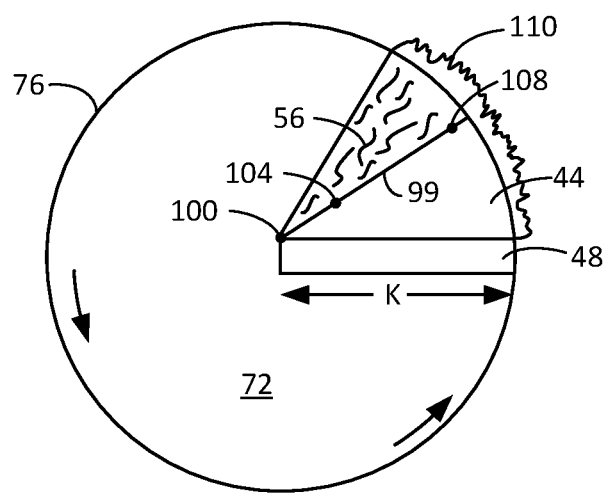
FIG. 5 is a schematic view of the transducer assembly according to the present invention.

The apertures 52 are oriented so that the volume of the fluid 56 is dispensed onto the surface 72 approximately underneath the side 66 (i.e. approximately underneath the leading edge of the transducer 44). Preferably, the angle of the face 67 is chosen so that the apertures 52 have the required orientation to dispense the fluid dispensed onto the desired location on the surface 72. As the substrate 76 rotates underneath the transducer 44, the volume of fluid 56 will fill the gap 68 uniformly underneath the resonator 64. Subsequently, the rotation of the substrate 76 will cause the volume of the fluid 56 to be spun off the edge of the substrate 76 as is illustrated in FIG. 5.

By dispensing the fluid 56 directly into the gap 68, the fluid is used immediately for the intended cleaning purpose before the physical properties of the fluid change. In a preferred embodiment, the following sequence is used in operating the transducer assembly 40: Start rotation of the substrate 76; begin dispensing the fluid 56 from the manifold 48; then turn on the acoustic energy source. At the end of the process, this sequence is usually reversed: Stop the acoustics; stop the fluid flow; then stop the rotation of the substrate 76. In other embodiments, different sequences can be used. Additionally, in other embodiments, the manifold 48 and the transducer 44 could be rotated while the substrate 76 is held stationary.

The fluid 56 may comprise any type of fluid that is suitable for cleaning or processing a substrate in conjunction with acoustic energy. Generally, the fluid 56 is a liquid, and aqueous liquids are very commonly used as the fluid 56. Examples of such aqueous liquids include deionized water or an aqueous solution of ammonium hydroxide, hydrogen peroxide, hydrochloric acid, nitric acid, acetic acid or hydrofluoric acid, or a combination of these reagents. The commonly used process fluid compositions referred to as SC-1 and SC-2 fluids can be used. However, many other fluids, including liquids having proprietary compositions may be used as the fluid 56.

Figure 4:
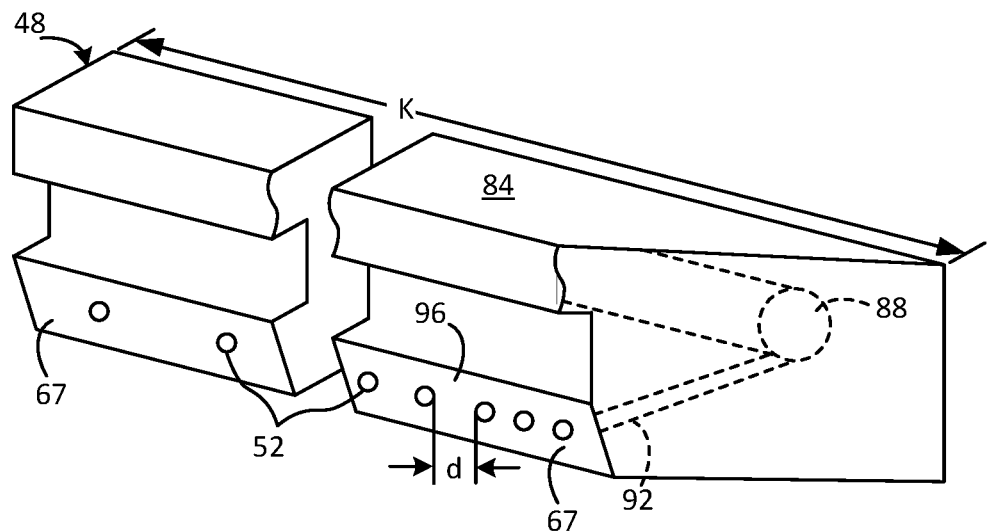
FIG. 4 is a schematic view of the fluid manifold according to the present invention.

FIG. 4 illustrates the fluid manifold 48 in more detail. The manifold 48 comprises a housing 84 which surrounds an interior fluid chamber 88. The fluid 56 enters the chamber 88 through a fluid inlet which is connected to the chamber 88. Each of the plurality of apertures 52 are connected to the chamber 88 by a fluid passageway 92. In the preferred embodiment, each aperture 52 has its own passageway 92, but other configurations could be used. Together, a single aperture 52 and its corresponding passageway 92 provide the pathway for the fluid 56 to be dispensed onto the surface 72 from the chamber 88. The plurality of apertures 52 extend along a length "K" of the manifold 48. In some embodiments, features are positioned inside of the manifold to evenly distribute the fluid before it is dispensed from the apertures.

The housing 84 is comprised of a material which is compatible with the fluid 56 being dispensed, meaning that the material is chemically resistant to the fluid 56. Suitable materials for the housing 84 include many chemically inert materials, such as stainless steel, quartz, polypropylene (PP), chlorinated polyvinyl chloride (CPVC), polytetrafluoroethylene (PTFE), and polyvinylidene fluoride (PVDF). Other materials, such as sapphire, vitreous carbon, diamond coated materials, silicon carbide, silicon nitride, or any other material that does not contaminate the fluid 56 may also be used for constructing housing 84.

In the preferred embodiment, each of the plurality of apertures 52 are circular openings in the housing 84, with each of the apertures 52 being connected to the interior fluid chamber 88 by a separate fluid passageway 92. In other embodiments, the apertures 52 can have other shapes, such as square, rectangular, triangular or an irregular shape. In the preferred embodiment, a space 96 exists between each aperture 52 and the aperture 52 that is next to it. The space 96 has a length "d" measured from the edge of the adjacent apertures 52, and the length "d" can vary between different sets of adjacent apertures. Additionally, the size of each of the apertures 52 can vary. For circular shaped apertures, this means that the diameter of the aperture 52 can vary. Depending on the particular use, some of the apertures will have the same diameters while other apertures 52 will have different diameters. Similarly, some of the apertures 52 will be separated by the same distance "d" while other apertures 52 will be separated by a different distance "d."

FIG. 5 illustrates a situation where the substrate 76 is rotating and the surface 72 is circular in shape. The transducer 44 has the shape of a circular sector (wedge shape) and the length of the transducer 44 along a side 99 corresponds to a radius "r" of the surface 72. The length "K" of the manifold 48 is approximately equal to the radius "r" and extends in the same direction as a radius of the surface 72. A position 100 on the side 99 corresponds to the approximate geometric center of the surface 72. A position 104 is a first distance away from the position 100 on the side 99 and a position 108 is a second distance away from the position 100 on the side 99, with the position 108 being a greater distance from the position 100 than is the position 104. The transducer 44 is said to have a wedge shape because the transducer 44 has a first end that includes the position 104 and a second end that includes the position 108, with the second end being wider than the first end. FIG. 5 illustrates a situation where the substrate 76 is rotating and the surface 72 is circular in shape. The transducer 44 has the shape of a circular sector (wedge shape) and the length of the transducer 44 along a side 99 corresponds to a radius "r" of the surface 72. The length "K" of the manifold 84 is approximately equal to the radius "r" and extends in the same direction as a radius of the surface 72. A position 100 on the side 99 corresponds to the approximate geometric center of the surface 72. A position 104 is a first distance away from the position 100 on the side 99 and a position 108 is a second distance away from the position 100 on the side 99, with the position 108 being a greater distance from the position 100 than is the position 104. The transducer 44 is said to have a wedge shape because the transducer 44 has a first end that includes the position 104 and a second end that includes the position 108, with the second end being wider than the first end.

Fluid 56 dispensed from the manifold 48 covers a portion of the surface 72, while the remainder of the surface 72 is not necessarily covered with the fluid 56. The rotation of the substrate 76 will cause the fluid 56 to be spun off the edge of the substrate 76 as is illustrated by a fluid region 110. FIG. 5 illustrates that by properly adjusting the flow rate of the fluid 56 dispensed by the manifold 48, the total volume of fluid used to clean or process the surface 72 can be minimized. This is because the whole surface area of the surface 72 does not need to be constantly covered with the fluid 56.

The reason for designing the manifold 48 with apertures in which the distance "d" and/or the diameter of the apertures 52 is variable is that it provides a method for dispensing a variable amount of fluid from the manifold 48 at different distances along the length "K" of the manifold 48. There are a number of reasons that dispensing a variable amount of fluid from the manifold along its length is desirable. For example, referring to FIG. 5, a greater volume of the fluid 56 may be required to fill the gap 68 (shown in FIG. 3) under the transducer 34 at the position 108 than is required at the position 104. One explanation for this fact is that the rotating substrate 76 has a greater linear velocity at the position 108 than at the position 104. The greater linear velocity means that fluid dispensed on the surface 72 near the position 108 is carried away from the manifold 84 faster than is fluid dispensed on the surface 72 near the position 104.

Another reason for this is that the wedge shape of the transducer 34 means that the transducer 34 covers more surface area of the surface 72 at the position 108 than at the position 104. Because it is desirable to have an approximately uniform volume of fluid 56 everywhere in the gap 68, more fluid needs to be dispensed at the position 108 than at the position 104. In any event, the need for dispensing a variable amount of fluid from the manifold 48 at different distances along the length "L" can be accomplished by varying the diameter of the apertures 52, such as by making the diameter of the of the apertures 52 smaller near the position 104 relative to the diameter of the apertures 52 near the position 108.

Alternatively, the distance "d" between the apertures can be designed to dispense a variable amount of fluid from the manifold 48. For example, the distance "d" between the apertures can be larger near the position 104 relative to the distance "d" between the apertures 52 near the position 108. Yet another approach is to increase the number of apertures 52 at a chosen location, such as by making one or more vertical clusters of apertures 52 near the chosen location. Other design features that would allow a variable amount of fluid to be dispensed from the manifold 48 include using one or more slots with varying widths to dispense the fluid, using spray nozzles with variable flow rates as the apertures 52 to dispense the fluid, or varying the angle of the apertures 52 at different locations. Additionally, a combination of any of these approaches can be used to dispense a variable amount of fluid from the manifold 48.

Figure 6:
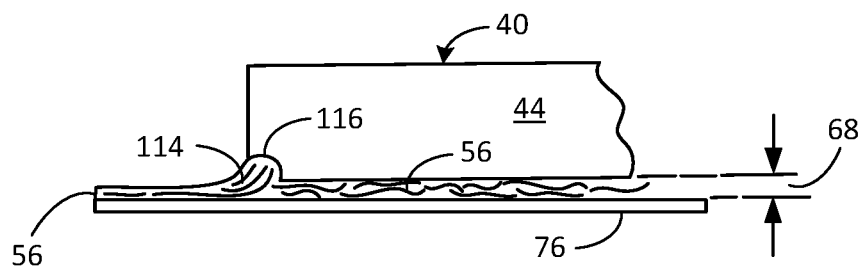
FIG. 6 is a schematic view of the proper fluid fill in the gap according to the present invention.

FIG. 6 illustrates the proper amount of fluid 56 that should fill the gap 68 when a wedge-shaped transducer is used as the transducer 44. Essentially, the amount of fluid 56 being dispensed from the manifold 48 when the substrate 76 is rotating at a particular speed should be adjusted so that the gap 68 is completely filled with fluid and a meniscus 114 of fluid builds up at an edge 116 of the transducer 44. The meniscus 114 should be clearly formed, but it should not be excessive in size. If the meniscus 114 is too large, then too much fluid is being used. If the meniscus 114 is not present at the edge 116, then too little fluid is being used.

In a preferred embodiment, the transducer assembly 40 comprises a wedge shaped acoustic transducer 44 and a fluid manifold 48 that dispenses a variable amount of the fluid 56 into the gap 68. Preferably, the substrate is circular and a relative rotational motion exists between the substrate and the assembly, meaning that either the substrate or the assembly is rotating (although typically the substrate is rotated). The use of the manifold 48 keeps the gap 68 between the transducer and substrate filled with fluid even though the linear velocity of the surface of the rotating circular substrate increases as the distance from the center of the substrate increases. It takes more fluid to fill the gap at the faster relative speeds, so you need more fluid flow at the outer radius than the inner radius. This also allows the exact amount of fluid that is required to keep the gap filled to be selected.

The term variable amount of fluid means that the manifold can dispense fluid at different rates (volume per unit time) along the length of the manifold. For example, where the manifold includes at least a first aperture and a second aperture, the first aperture would dispense a different volume of fluid than the second aperture in a given unit of time. Stated differently, the first aperture would dispense fluid at a different rate than the second aperture.

The use of the manifold 48 also allows for higher rotational speeds than typical fluid dispense systems, while using less fluid. For example, if the substrate 76 comprises a 300 mm semiconductor wafer, a rotational speed of approximately 100 rpm can be used. Additionally, injecting the fluid 56 directly under the resonator 64, in the gap 68, prevents the fluid form changing properties before it is used. Furthermore, the injection of the fluid into the gap will allow the substrate and transducer to be used in orientations other than the horizontal plane.

In general, the use of the manifold 48 allows the substrate 76 to be rotated at higher speeds (revolutions per minute or "rpm") than is otherwise possible. In addition to the advantages listed above, another advantage associated with higher rotational speeds is that for particle removal processes, the particle gets removed from the substrate surface more quickly at the higher frequency. An additional advantage is that the use of higher rotational speeds allows the fluid to be refreshed more often. If a chemical process is mass transfer limited, this is a desirable feature.

Additional uses of the assembly 40 are that the backside of a substrate can also be cleaned. The backside means, for example, the side opposite the surface 72 shown in FIG. 3. Furthermore, the substrate 76 does not need to be positioned horizontally to be cleaned with the assembly 40. The substrate 76 could be positioned vertically or at any angle, because the manifold 48 will dispense fluid directly into the gap 68, regardless of the orientation of the substrate 76.

In a preferred embodiment, the fluid manifold of the present invention comprises a manifold adapted to deliver fluid directly into a gap formed between a surface of a substrate and an acoustic transducer, with the fluid being delivered into the gap at a variable rate along a length of the manifold. Preferably, the manifold includes a plurality of apertures positioned along the length of the manifold for dispensing the fluid into the gap. The use of properly positioned apertures along the manifold is an example of how the manifold is adapted to deliver fluid directly into a gap.

To achieve the variable rate of fluid delivery, the plurality of apertures may comprise at least a first aperture and a second aperture, with the first aperture dispensing the fluid at a different rate than the second aperture. Alternatively, to achieve the variable rate of fluid delivery the plurality of apertures may comprises at least a first aperture that is circular in shape and has a first diameter and a second aperture that is circular in shape and has a second diameter, with the first diameter being different in size than the second diameter.

In another embodiment, the plurality of apertures comprises at least a first aperture, a second aperture and a third aperture, with the first aperture and the second aperture being adjacent to each other and separated by a first distance and the second aperture and the third aperture being adjacent to each other and separated by a second distance, with the first distance being different than the second distance. FIG. 4 illustrates the distance "d" between two adjacent apertures 52.

In another preferred embodiment, the transducer assembly of the present invention comprises an acoustic transducer adapted to deliver acoustic energy to a surface of a substrate and a manifold positioned along an edge of the acoustic transducer. The manifold is positioned to deliver fluid directly into a gap formed between the surface of the substrate and the acoustic transducer, with the fluid being delivered at a variable rate along a length of the manifold. Preferably, the acoustic transducer has a wedge shape, although other shapes may be used for the transducer. The wedge shape of the transducer is illustrated in FIGS. 2 and 5 for the transducer 44. The gap into which the fluid is delivered is illustrated in FIGS. 3 and 6 as the gap 68.

Although the substrate 76 has been described as a semiconductor wafer, the transducer assembly 40 can be used with other substrates such as other types of wafers, optical photo masks, EUV masks, nano-imprint masters, aluminum or glass hard disks, square or round crystalline silicon solar substrates, square or round polysilicon solar substrates, glass, ceramic or any other rotating substrate that requires a fluid and acoustic sound energy.

Additionally, the transducer 44 can have other shapes, such as a rectangular shape. A transducer having a rectangular shape (or some other shape) can be used to clean the following types of substrates when the transducer is placed in proximity to the substrate that is moving linearly relative to the transducer: flat panel displays, glass sheets, OLED panels, solar panels, monocrystalline or polycrystalline silicon substrates, photomasks, EUV masks, screens or any other rotating, or linearly scanned, substrate that requires a process fluid and acoustic sound energy.

Figure 7:
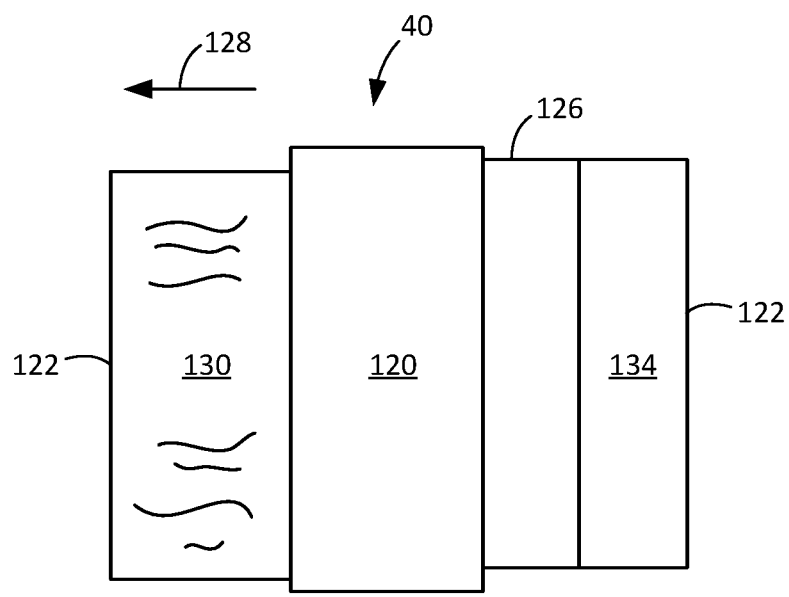
FIG. 7 is a top view of a rectangular-shaped (bar) transducer assembly according to the present invention.

FIG. 7 illustrates a case where the transducer 44 is a rectangular-shaped (bar) transducer 120 and a substrate 122 that is not rotating. In this case, the assembly 40 is comprised of the bar transducer 120 and a manifold 126. The manifold dispenses fluid 56 into a gap between the transducer 120 and the surface of the substrate 122 as was described previously with respect to FIG. 3. Relative movement between the assembly 40 and the substrate 122 exists, meaning that either the substrate 122 or the bar transducer 120 can be moving (indicated by the arrow 128). This means that a region 130 of the substrate will be covered with the fluid 56 and a dry region 134 in front of the manifold will not be covered with fluid 56. As the relative motion between the substrate and the assembly 40 becomes faster, either more fluid must be used or the gap between the transducer 120 and the surface of the substrate 122 must be made smaller.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. An apparatus comprising:
   a manifold configured for placement adjacent to an acoustic transducer;
   an angled face extending along a length of the manifold, with the angled face being oriented to deliver a fluid directly into a gap formed between a surface of a circular substrate and the acoustic transducer when the manifold has been placed adjacent to the acoustic transducer and the acoustic transducer is positioned adjacent to the circular substrate; and
   at least a first aperture and a second aperture positioned in the angled face for dispensing the fluid into the gap, with the first aperture being configured to dispense the fluid at a different rate than the second aperture, whereby a variable amount of the fluid can be delivered into the gap along at least part of the length of the manifold through the first and second apertures.

2. The apparatus of claim 1 wherein the manifold includes a plurality of apertures for dispensing the fluid into the gap, the manifold comprised of more than two apertures.

3. The apparatus of claim 2 wherein the plurality of apertures comprises at least the first aperture, the second aperture and a third aperture, with the first aperture and the second aperture being adjacent to each other and separated by a first distance and the second aperture and the third aperture being adjacent to each other and separated by a second distance, with the first distance being different than the second distance.

4. The apparatus of claim 1 wherein the first aperture is circular in shape and has a first diameter and the second aperture is circular in shape and has a second diameter, with the first diameter being different than the second diameter.

5. The apparatus of claim 1 wherein the length of the manifold extends parallel to a radius of the circular substrate when the manifold has been placed adjacent to the acoustic transducer and the acoustic transducer is positioned adjacent to the circular substrate.

6. An apparatus comprising:
   a manifold configured for placement adjacent to an acoustic transducer, with the manifold having an angled face that extends along a length of the manifold and faces in the direction of the acoustic transducer, and with the angled face of the manifold extending parallel to a radius of a circular substrate when the manifold is positioned over the circular substrate; and
   a plurality of apertures positioned in the angled face for dispensing a fluid directly into a gap formed between a surface of the circular substrate and the acoustic transducer, the plurality of apertures including at least a first aperture and a second aperture positioned along the length of the manifold for dispensing the fluid into the gap, with the first aperture dispensing the fluid at a different rate than the second aperture, whereby a variable amount of the fluid can be delivered into the gap along at least some of the length of the manifold.

7. The apparatus of claim 6 wherein the first aperture is circular in shape and has a first diameter, and the second aperture is circular in shape and has a second diameter, with the first diameter being different than the second diameter.

8. The apparatus of claim 6 further comprising a third aperture, with the first aperture and the second aperture being adjacent to each other and separated by a first distance, and the second aperture and the third aperture being adjacent to each other and separated by a second distance, with the first distance being different than the second distance.

9. The apparatus of claim 6 wherein the gap is formed between a resonator on the acoustic transducer and the surface of the circular substrate.

10. The apparatus of claim 1 wherein the fluid is a liquid for cleaning the surface of the circular substrate.

11. The apparatus of claim 6 wherein the fluid is a liquid for cleaning the surface of the circular substrate.

* * * * *